(12) United States Patent
Kotovsky et al.

(10) Patent No.: US 11,962,129 B2
(45) Date of Patent: Apr. 16, 2024

(54) SYSTEMS AND METHODS FOR LASER DIODE ARRAY HAVING INTEGRATED MICROCHANNEL COOLING

(71) Applicants: Lawrence Livermore National Security, LLC, Livermore, CA (US); Colorado State University Research Foundation, Fort Collins, CO (US)

(72) Inventors: Jack Kotovsky, Alameda, CA (US); Salmaan H. Baxamusa, Livermore, CA (US); Clint D. Frye, Livermore, CA (US); Ian Seth Ladner, Livermore, CA (US); Thomas M. Spinka, Livermore, CA (US); Devin Joseph Funaro, Livermore, CA (US); David Ryan Hobby, Wellington, CO (US); Caleb Del Anderson, Fort Collins, CO (US); Todd Bandhauer, Fort Collins, CO (US)

(73) Assignees: Lawrence Livermore National Security, LLC, Livermore, CA (US); Colorado State University Research Foundation, Fort Collins, CO (US)

( * ) Notice: Subject to any disclaimer, the term of this patent is extended or adjusted under 35 U.S.C. 154(b) by 266 days.

(21) Appl. No.: 17/227,132

(22) Filed: Apr. 9, 2021

(65) Prior Publication Data
US 2022/0329048 A1 Oct. 13, 2022

(51) Int. Cl.
*H01S 5/40* (2006.01)
*H01S 5/024* (2006.01)

(52) U.S. Cl.
CPC ........ *H01S 5/4025* (2013.01); *H01S 5/02423* (2013.01)

(58) Field of Classification Search
CPC .. H01S 5/02492; H01S 5/02423; H01S 5/405; H01S 5/024; H01S 5/40
(Continued)

(56) References Cited

U.S. PATENT DOCUMENTS

| 4,450,472 A | 5/1984 | Tuckerman et al. |
| 2004/0190251 A1* | 9/2004 | Prasher ................ H01L 23/473 257/E23.098 |

(Continued)

FOREIGN PATENT DOCUMENTS

KR 10-2019-0132874 A 11/2019

OTHER PUBLICATIONS

Van Erp R. et al. "Co-designing electronics with microfluidics for more sustainable cooling." Nature, 585.7824 (2020): 211-216.
(Continued)

*Primary Examiner* — Tuan N Nguyen
(74) *Attorney, Agent, or Firm* — HARNESS, DICKEY & PIERCE, P.L.C.

(57) ABSTRACT

The present disclosure relates to a laser diode system. The system may have at least one laser diode emitter having a substrate, at least one laser diode supported on the substrate, and a facet which a laser beam generated by the laser diode is emitted. A cooling subsystem is included which is disposed in contact with the substrate of the laser diode emitter. The cooling subsystem includes a plurality of cooling fins forming a plurality of elongated channels for circulating a cooling fluid therethrough to cool the laser diode emitter. The cooling fluid also flows over the facet of the laser diode emitter.

22 Claims, 7 Drawing Sheets

(58) Field of Classification Search
USPC .......................................................... 372/5
See application file for complete search history.

(56) References Cited

U.S. PATENT DOCUMENTS

| | | | |
|---|---|---|---|
| 2005/0047456 A1* | 3/2005 | Rice ...................... | H01S 5/0243 |
| | | | 372/43.01 |
| 2005/0139992 A1* | 6/2005 | Holalkere ............. | H01L 23/473 |
| | | | 438/117 |
| 2005/0151140 A1 | 7/2005 | Honma et al. | |
| 2006/0203866 A1 | 9/2006 | Stephens | |
| 2009/134421 A1 | 5/2009 | Negley | |
| 2009/0140417 A1* | 6/2009 | Refai-Ahmed ....... | H01L 23/427 |
| | | | 257/707 |
| 2012/0281725 A1* | 11/2012 | Huff ..................... | H01S 5/02355 |
| | | | 257/E33.056 |

OTHER PUBLICATIONS

Wang, Z. M., et al. "Microfluidic cooling of semiconductor light emission diodes." Microelectronic engineering 84.5-8 (2007):1223-1226.

Feeler, Ryan, et al. "Reliable cooling of high-power laser diode arrays." International Congress on Applications of Lasers & Electro-Optics, vol. 2008, No. 1, Laser Institute of America, 2008.

Treusch, Georg, et al. "Reliability of water-cooled high-power diode laser modules." High-Power Diode Laser Technology and Applications III, vol. 5711, International Society of Optics and Photonics, 2005.

Pegau, W.S., Gray, D., Zaneveld, J.R.V. Absorption and attenuation of visible and near-infrared light in water: dependence on temperature and salinity, Appl. Opt., 36 (1997) pp. 6035-6046. https://doi.org/10.1364/AO.36.006035.

Curcio, J.A., Petty, C.C. The Near Infrared Absorption Spectrum of Liquid Water, J. Opt. Soc. Am., JOSA. 41 (1951), pp. 302-304. https://doi.org/10.1364/JOSA.41.000302.

Kmetik V., Kanabe, T., Fujita, H. Optical Absorption in Fluorocarbon Liquids for the High Energy Stimulated Brillouin Scattering Phase Conjugation and Compression, The Review of Laser Engineering, 26 (1998), pp. 332-327. https://doi.org/10.2184/lsj.26.322.

Robert, C.W. et al. Absorption coefficient of liquid ammonia in the visible region. J. Opt. Soc. Am 63 (1973) p. 763.

International Search Report and Written Opinion regarding Patent Application No. PCT/US2022/023796, dated Jul. 27, 2022.

* cited by examiner

SYSTEMS AND METHODS FOR LASER DIODE ARRAY HAVING INTEGRATED MICROCHANNEL COOLING

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to laser diode arrays, and more particularly to a laser diode array system having an integrated, microchannel cooling subsystem.

BACKGROUND

The statements in this section merely provide background information related to the present disclosure and may not constitute prior art.

High powered laser diodes are used in a wide variety of applications. Many applications require very large heat flux removal, for example, greater than about 400 W/cm$^2$, and into the 1000's of W/cm$^2$.

Figure 1:
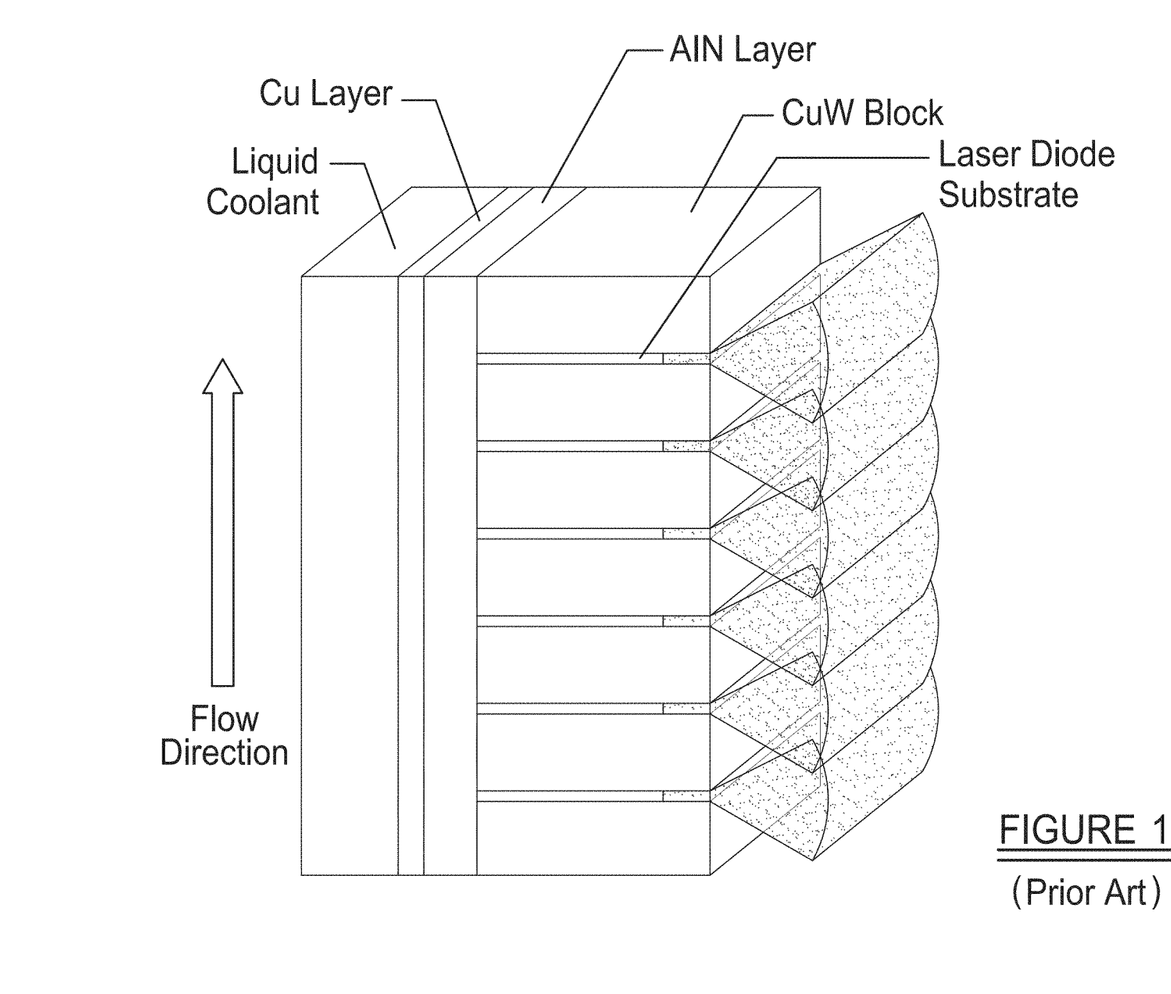
FIG. 1 is a high level perspective view illustrating a construction of a prior art cooling subsystem integrated into a prior art diode array.

Heat removal from laser diodes to the ultimate cooling fluid is the fundamental limitation for state-of-the-art laser diode systems. Heat generated at the surface of the diode must be transported through a variety of intervening thermal barriers to the ultimate cooling fluid. This heat is conducted along extended surfaces, which impose thermal gradients onto the surface of the diode, potentially limiting their lifetime and performance. One example of this is shown in the conventional laser diode construction of FIG. 1. The liquid coolant flows along the rear sides of a copper plate "Cu", which in turn is in contact with an AlN layer. The AlN layer extends perpendicular to, and spans, a plurality of CuW blocks that are interspersed between the laser diode substrates. As such, heat conduction must occur through a significant mass and distance of material separating the coolant flow from the heat generating emitters of each laser diode.

In present day state-of-the-art laser diode cooling systems, the co-inventors of the present disclosure have observed that heat is non-uniformly conducted from individual emitters and bars in a bar stack, which undesirably broadens the emitted wavelength spectrum. Furthermore, significant, undesirable temperature gradients between adjacent contacting components of the system induce stresses in the bar stacks that can reduce diode lifetimes.

Next generation laser diode systems require improved heat removal in confined spaces to allow brighter diode arrays to be produced. Optical light power desired is proportional to the heat that can be removed from the diodes. Heat extraction and temperature control currently limit future performance of high power systems. There is a strong need in industry for increasingly more powerful laser systems, but such will require unique approaches to even more effective heat removal from laser diode systems.

SUMMARY

This section provides a general summary of the disclosure, and is not a comprehensive disclosure of its full scope or all of its features.

In one aspect the present disclosure relates to a laser diode system. The system may comprise at least one laser diode emitter having a substrate and a laser diode supported on the substrate, the laser diode emitting a laser beam from a facet supported on the substrate. A cooling subsystem is disposed in contact with the substrate of the laser diode emitter. The cooling subsystem includes a plurality of cooling fins forming a plurality of elongated channels for circulating a cooling fluid therethrough to cool the laser diode emitter. The cooling fluid flows over the facet of the laser diode emitter.

In another aspect the present disclosure relates to a laser diode system. The system may comprise a plurality of laser diode emitters supported on a single substrate and these substrates may then be stacked and arrayed. Each substrate may have a plurality of laser diode emitters supported on the substrate, and a facet supported on the substrate from which a laser beam is emitted. A cooling subsystem is in contact with the plurality of laser diode emitters and includes a base portion and a plurality of cooling fluid flow channels formed by a plurality of elongated fins projecting outwardly from the base portion. The elongated fins are sufficient in number to span substantially a full width of all of the plurality of laser diode emitters. The cooling fluid flow channels are configured to circulate a cooling fluid therethrough to cool the laser diode emitters. The cooling fluid also flows over the facet of the laser diode emitter.

In still another aspect the present disclosure relates to a method for cooling a laser diode system. The method comprises providing at least one laser diode emitter having a substrate and a laser diode supported on the substrate from which a laser beam is emitted. The method further may include arranging a cooling subsystem in contact with the substrate of the laser diode emitter. The method may further include flowing a cooling fluid through channels formed between fins of the cooling subsystem, where the fins project from a base portion of the cooling subsystem. The method may further include flowing the cooling fluid over the facet of the laser diode emitter and into the elongated channels.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, in which.

DETAILED DESCRIPTION

Example embodiments will now be described more fully with reference to the accompanying drawings.

The present disclosure provides new systems and methods which significantly improve heat extraction from laser diodes, improving thermal uniformity across laser diode emitters and bars, reducing stress on the laser diodes to extend diode lifetimes, and reducing the temperature difference between the laser diodes and the cooling fluid being used to cool them. The smaller delta-temperature serves to significantly reduce the size, weight and power of an overall laser diode system.

Figure 2:
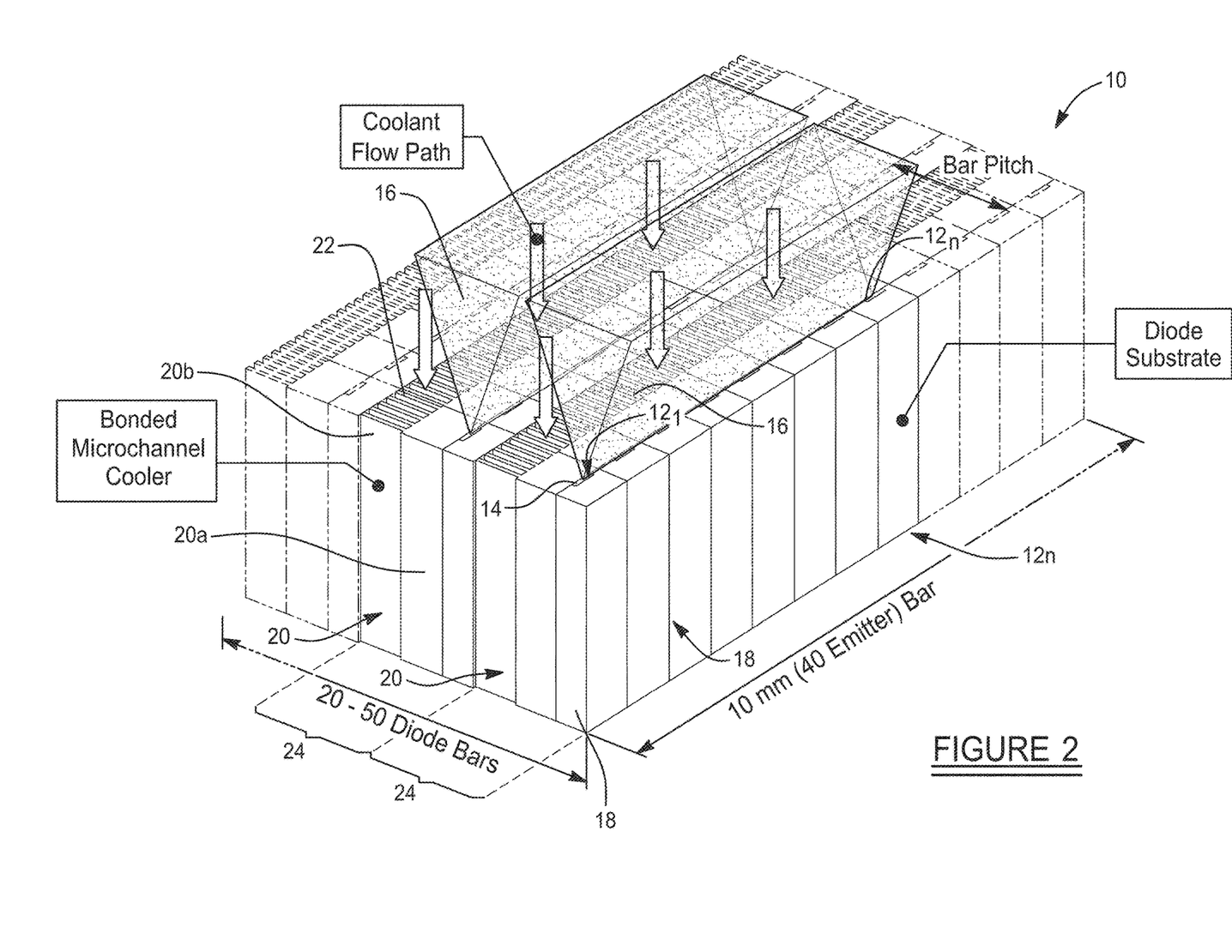
FIG. 2 is a high level perspective view of one embodiment of a laser diode array system with an integrated cooling subsystem in accordance with the present disclosure.

Referring to FIG. 2, one embodiment of a laser diode system 10 (hereinafter simply "system 10") in accordance with the present disclosure is shown. The system incorporates a plurality of laser diode emitters $12_1$-$12_n$ (sometimes referred to in the industry simply as laser diodes or the substrate with multiple emitters as a laser diode "bar"). The laser diode emitters $12_1$-$12_n$ are arranged adjacent one another in a compact configuration. A facet 14 of each diode emitter $12_1$-$12_n$ projects a laser beam 16 outwardly from an end of its associated diode emitter, with the laser beams 16 being projected parallel to a common longitudinal axis.

The diode emitters $12_1$-$12_n$ are all built on a single, monolithic diode substrate 18 on one surface, and bonded to a microchannel cooling subsystem 20 on an opposing surface. Optionally, each diode emitter $12_1$-$12_n$ may have a separate, independent section of the diode substrate 18 bonded thereto (a single emitter), although it is anticipated that the more powerful and economical approach, from both a manufacturing and assembly standpoint, will be to use the single monolithic diode substrate (a laser diode bar) 18 as shown in FIG. 2.

The microchannel cooling subsystem 20 in one embodiment includes a base portion 20a and a plurality elongated, parallel cooling fins 20b projecting therefrom. The cooling fins 20b form elongated cooling channels 22 between each adjacent pair of cooling fins 20b. The base portion 20a may be bonded to the substrate 18 via a suitable bonding agent (e.g., AuSn solder joint or other metallic joints). It is a principal benefit that the base portion 20a is bonded to the surface of the substrate 18 where the facet is present. This presents the base portion 20a as close as possible to the emitter and its facets 14, where the most heat is generated by the laser diode emitters $12_1$-$12_n$, to thus promote thermal uniformity across the emitter and to maximize the ability of the cooling subsystem 20 to "pull" or conduct heat out of the substrate 18.

In the embodiment shown in FIG. 2 the fins 20b and the base portion 20a are formed from a single, monolithic piece of material, but they need not be. Instead, the fins 20b could be formed from a separate piece of material which is bonded or secured in thermal contact with the base portion 20a. Optionally, the fins 20b and the base portion 20a could also be formed separately as a single unit for each diode emitter $12_1$-$12_n$. However, it is expected that the more preferred construction, from a thermal efficiency standpoint, will be forming the microchannel cooling subsystem 20 component from a single piece of material, with sections of material being removed to form the fins along a full length thereof. The fins 20b may also be formed directly in the diode bar 18 as well. The fins 20b may be formed in any suitable manner, such as by machining, etching, 3D printing the microchannels, etc., to either remove the needed sections of material to form the cooling fins 20b, or to otherwise form the microchannels that define the cooling fins. The fins 20b in this example are shown all arranged perpendicular to the substrate 18, with a common length, and such that they extend at least substantially a full length of the substrate 18, and in some embodiments the full length of the substrate, and parallel to a major longitudinal axis of the substrate. However, they need not all be formed perpendicular to the substrate 18, nor do all need to be the same length. The material used to form the microchannel cooling subsystem 20 may vary according to the needs of a specific application, but in one embodiment the material may be Silicon, Silicon Carbide (SiC) or Gallium Arsenide (GaAs). In another embodiment the material may be CuW (copper-tungsten). Still other embodiments may use other metallic or semiconductor materials that have preferred thermal properties that are close in thermal expansion to the laser diode emitter. The thermal expansion matching reduces stresses that are coupled between the laser diode emitter and its cooling subsystem 20. Use of an identical material of cooling subsystem 20 (e.g. GaAs) as the diode emitter will minimize stresses from joining these materials. CuW in particular is especially desirable as the added Tungsten synthesizes the thermal expansion of the microchannel cooling subsystem 20 with the thermal expansion of GaAs, which is a material commonly used to construct the laser diode emitters 18. One longitudinal group of the diode emitters $12_1$-$12_n$ together with its associated microchannel cooling subsystem 20 may be viewed as a "base unit" 24. FIG. 2 thus shows the system 10 configured with two base units 24, and such that the fins 20b of one base unit 24 are disposed against the substrate 18 of an adjacent base unit. This construction allows the system 10 to be configured with virtually any number of base units 24 in an X/Y grid fashion.

The size of the overall system 10 may vary considerably, as well as the geometry of the fins 20b and subsystem 20. In one embodiment, the aspect ratio of the rectangular cooling fins may be around 20:1 where the cooling fins 20b are 20 times taller than their width. In other embodiments, the cooling fins 20b may be non-rectangular to improve thermal transport and performance. A trapezoidal, triangular or curved-sidewall fin geometry may be employed. Additionally, the ratio of the cross-section of fin material to fluidic channel cross-section may be designed to achieve best thermal and system performance. The fin and channel geometries dictate thermal performance and pumping pressures that vary with material choices and will be designed for different embodiments of the hardware. Additionally, the height of 20a vs. 20b also bears upon thermal performance and total diode-stack pitch. A finer pitch of diode emitter to diode emitter enhances brightness of the system. Diode emitter bar substrate 18 thickness and subsystem 20 thickness will be designed to achieve best performance for different systems. Also, the position and size of the channel and fin design relative to the discrete emitter geometry also affects thermal performance. These geometry differences will all be designed to offer desired system performance.

Figure 2A:
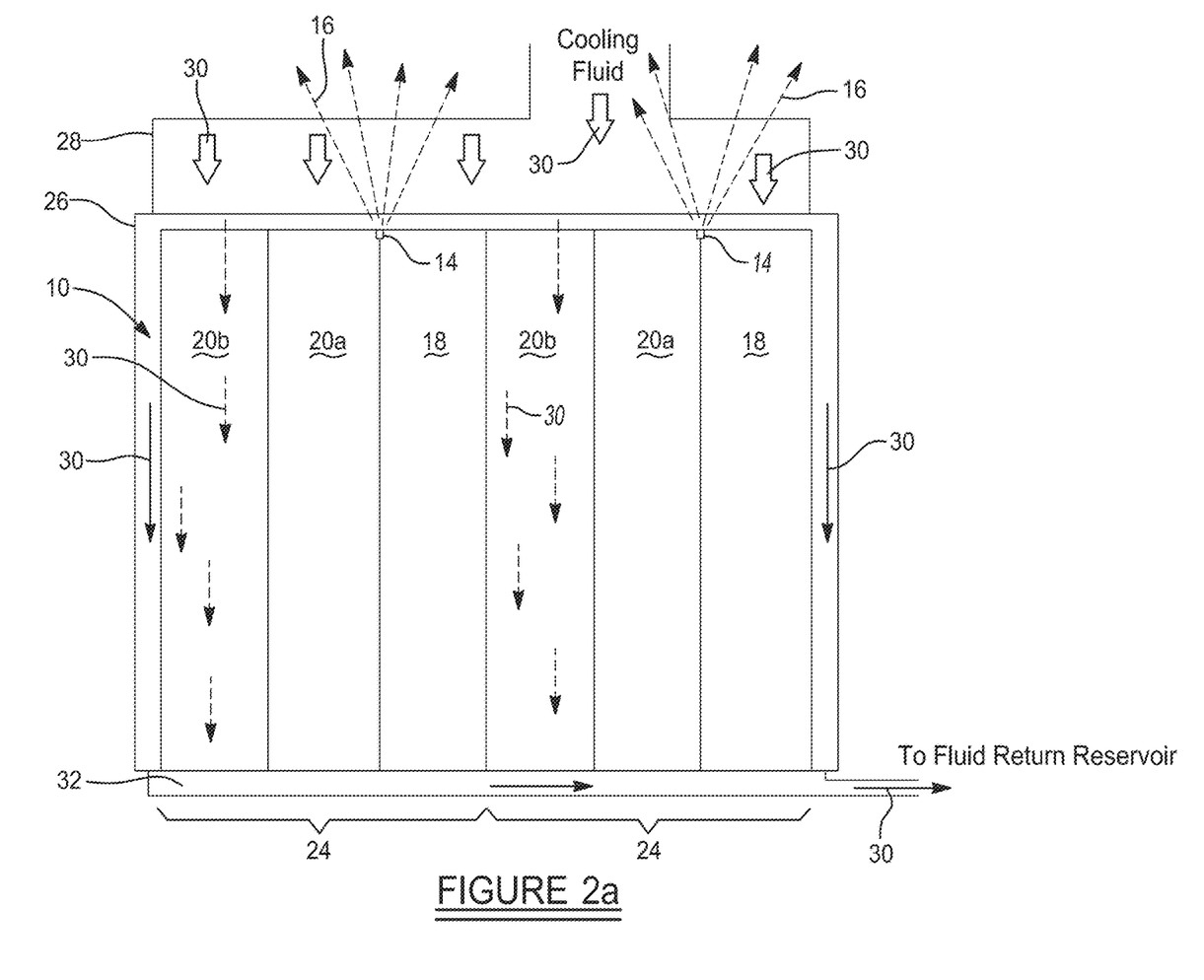
FIG. 2a shows the system being used in a "full immersion" configuration, wherein the entire laser diode array system is fully submerged in a container through which a cooling fluid is being flowed through the flow channels of the cooling subsystem.

When the laser diode bars with their substrates 18 are fully assembled with the respective microchannel cooler components 20, the cooling fins 20b of the microchannel cooling subsystem 20 form a plurality of parallel flow channels 22 through which a fluid 30 may flow. In one embodiment the fluid may be a liquid (e.g., water, liquid ammonia, dielectric cooling fluid, perfluorocarbon), while in other embodiments the fluid may be a gas. When a liquid is used as the cooling medium, the entire system 10 may be submerged in a suitable container filled with the electrically non-conductive liquid, as shown in FIG. 2a. This arrangement forms a "full immersion" configuration. The high level block diagram depiction in FIG. 2a illustrates the system 10 supported within a container 26 in a vertical orientation, with a suitable inlet manifold 28 supplying the cooling fluid 30 from a coolant reservoir (not shown) into an upper area of the container 26, and a suitable outlet manifold 32 for carrying the fluid to a fluid return reservoir. It will be appreciated that with such an embodiment, the laser beams 16 need to be able to emerge from the cooling fluid 30 and project out from the container 26 unobstructed, so the construction and/or placement of the inlet manifold 28 is important so that it doesn't project light-absorbing material into any portion of the path of the beams 16. Furthermore, with such an embodiment as shown in FIG. 2a, the properties of the cooling fluid 30 need to be considered, as the optical beam 16 being emitted from each diode emitter $12_1$-$12_n$ will be passing through the cooling fluid before reaching the intended target on which the beams 16 are acting.

With the embodiment of FIG. 2a, the depth of the layer of cooling fluid above the facets 14 is also an important consideration. Preferably, the depth of the layer of cooling fluid 30 should not exceed about 1 mm-5 mm, although the precise thickness level may vary considerably from this in actual implementations of the system 10, where a number of variables are at play (e.g., laser power, coolant distribution uniformity, absorption of the cooling fluid and lensing that may or may not be used). The cooling fluid used may also be biphasic, for example starting out exclusively as a liquid, and leaving the system 10 as a combination of liquid and gas. Optionally, the cooling fluid 30 may be exclusively in the form of a gas, for example Helium.

Figures 3, 4:
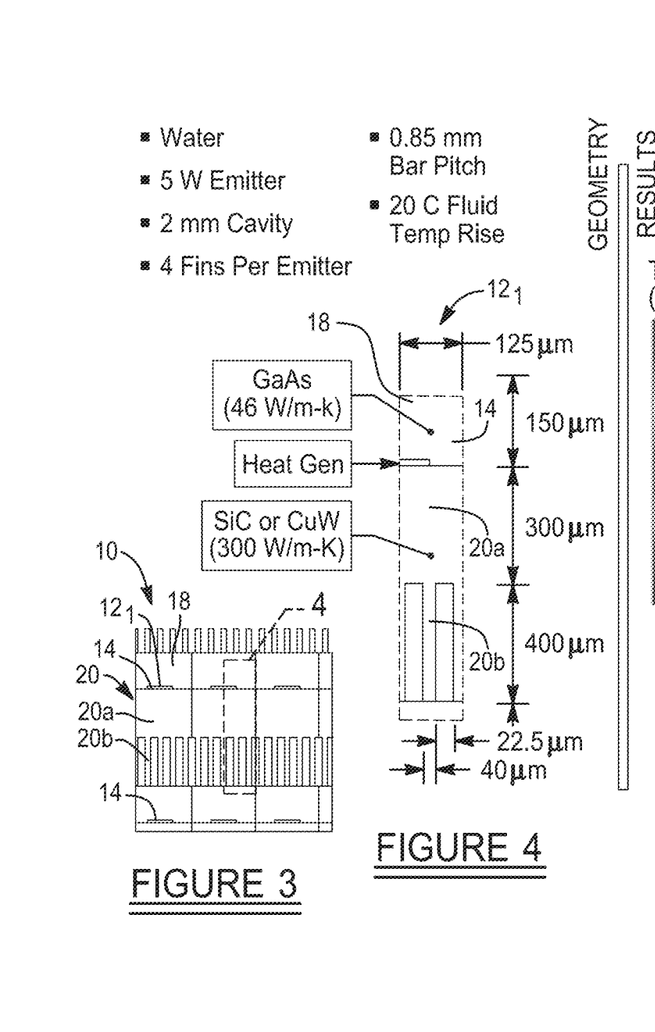
FIG. 3 is an end view of a portion of the laser diode array system of FIG. 2 looking down into the emitter.
FIG. 4 is an enlarged view of the rectangular section 4 indicated in FIG. 3.

With brief reference to FIGS. 3 and 4, the cooling fins 20b may also vary significantly in construction. FIG. 4 shows one example of the construction of the cooling fins 20b. The dimensions provided in FIG. 4 are intended to show one example for the construction of the microchannel cooling subsystem 20, and it will be appreciated that these dimensions may vary considerably to meet the needs of a specific application. In various embodiments the fins 20b have a thickness of 10 microns, or even smaller, or up to about 100 microns, or even greater. The depth of the fins 20b may vary considerably, but FIG. 4 shows the fins 20b with a depth of 400 microns, creating channels of about 22.5 microns in width.

Figures 5, 6, 7:
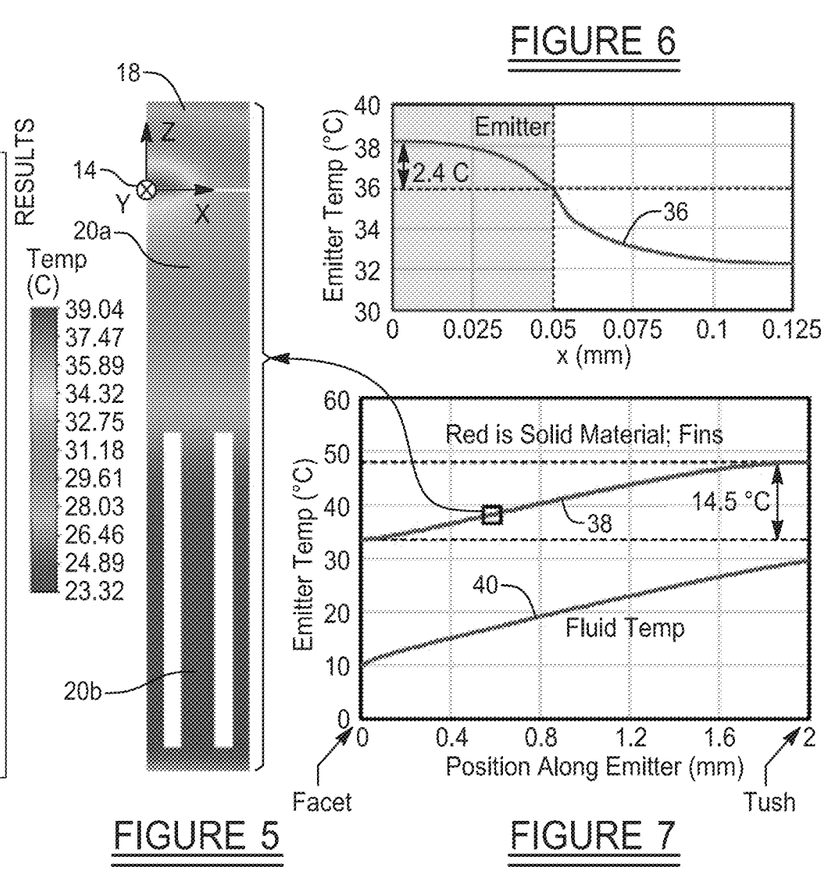
FIG. 5 is a thermal map from modeling of thermal performance of fin geometries and coolants.
FIG. 6 is a graph illustrating facet temperature uniformity along the X axis of FIG. 5 for the laser diode system of FIG. 2.
FIG. 7 shows graphs where the upper graph indicates diode bar and submount temperatures at various points along the length of the emitter of the system of FIG. 2, for the cooling fins of the cooling subsystem, and the lower graph indicates the temperature of a cooling fluid flowing along the length of a channel parallel to the emitter at various distances along the emitter.
Figure 8:
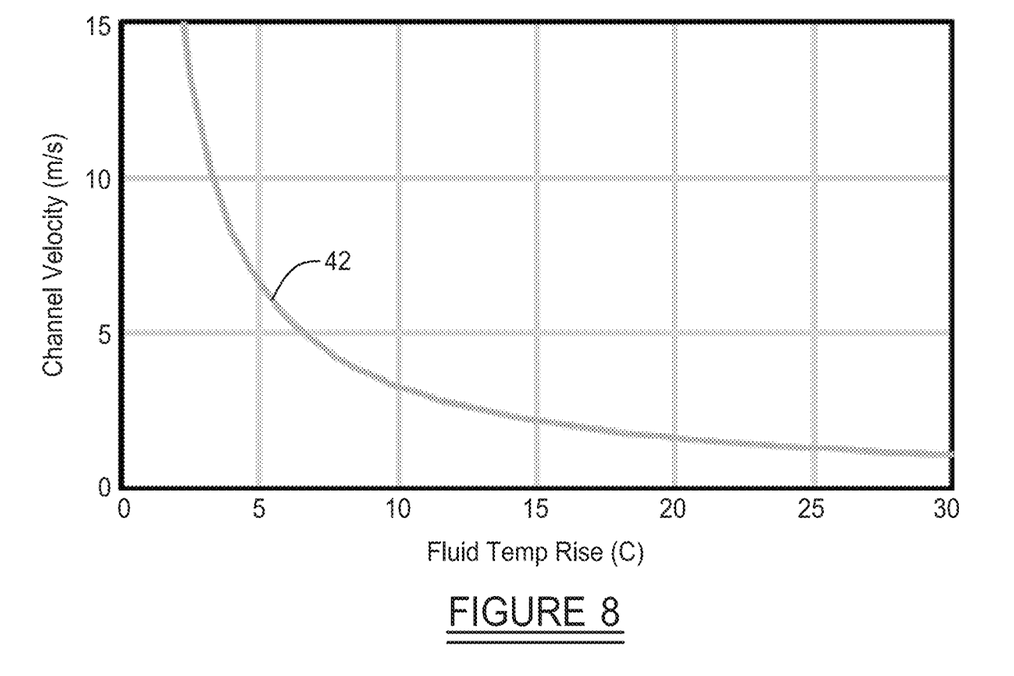
FIG. 8 shows a graph illustrating how the flow velocity of the cooling fluid through the channels is dependent on the difference in temperature between the diode and the cooling fluid at a tail end of the diode.

Referring to FIGS. 5, 6, 7 and 8, the thermal performance of the microchannel cooling subsystem 20 can be seen. FIG. 5 illustrates the heat distribution across the cooling fins 20b and the base portion 20a. FIG. 6 illustrates a thermal curve 36 illustrating how the temperature drops as one moves away from the center of the emitter $12_1$-$12_n$ at an arbitrary position along the emitter length. Thermal gradients across the facet influence emitter stresses and diffraction. These cooling designs allow exceptional control of these parameters to design the system for performance needed. FIG. 7 illustrates how the temperature of the cooling fluid 30, represented by curve 40, generally tracks that of the emitter $12_1$-$12_n$, which is represented by curve 38. By understanding the nature of codependent interaction between curve 40 and curve 38, a small temperature difference from emitter end to end can be designed to improve lifetime if stresses result from thermal gradients. Several different techniques could be implemented to control the profile of curve 38 to match the needs of a particular application, including fin geometry design, cooling fluid 30 selection, microchannel cooling subsystem 20 material selection, cooling fluid flow velocity adjustment, and controlled onset of nucleate boiling for biphasic flow. FIG. 8 shows a curve 42, representing one exemplary configuration given an exemplary set of conditions, illustrating how the flow velocity of the cooling fluid plays a significant part in controlling the fluid temperature rise, thus influencing emitter temperature 38, as the cooling fluid 30 flows through the cooling channels 22. As is apparent in FIG. 7, reducing fluid temperature rise will result in a flattening of the cooling fluid temperature curve 40 but will increase fluid velocities and related pumping pressures. This will, in turn, cause the emitter temperature curve 38 to become flatter as well, thus improving thermal uniformity along the length of the emitter $12_1$-$12_n$.

Figure 9:
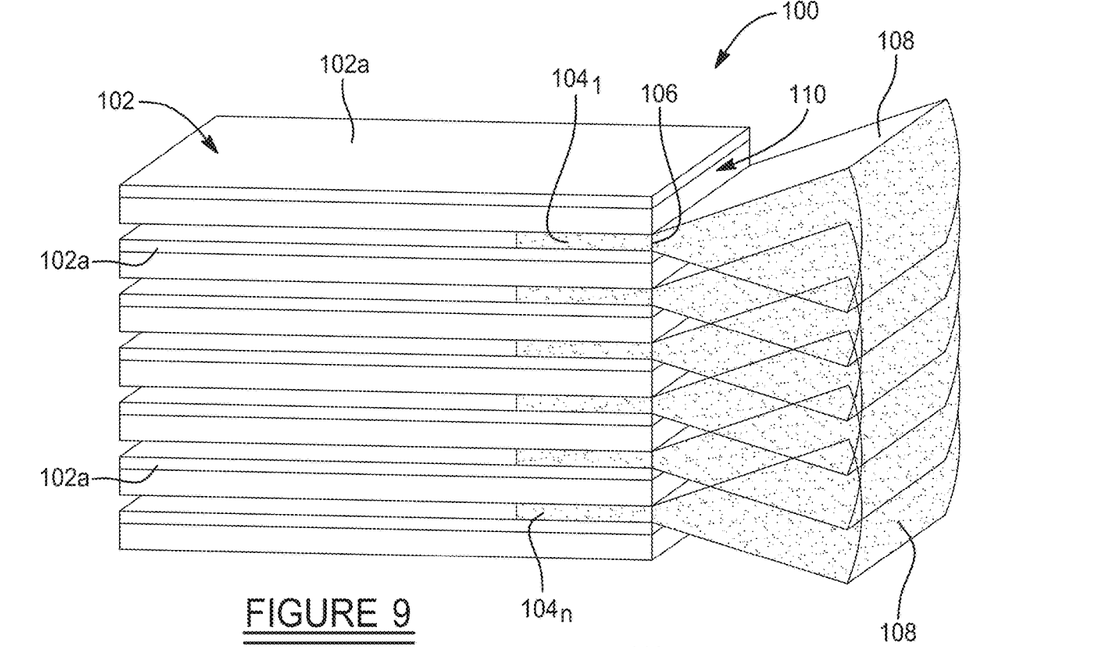
FIG. 9 shows another embodiment of the present disclosure incorporating an "interleaved" cooling subsystem.
Figure 10:
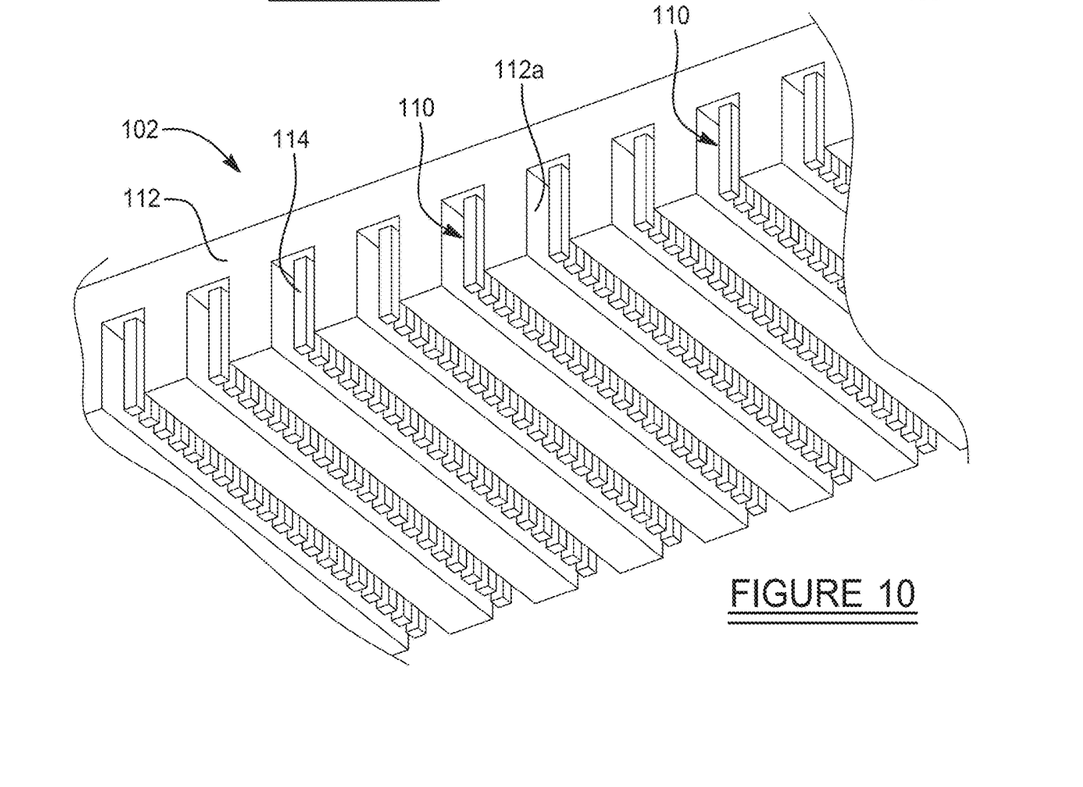
FIG. 10 a highly enlarged perspective view of one portion of the cooling fins formed for the system of FIG. 9, the fins can have varied geometry including texturing or patterning to induce varied, design fluid flows and improved thermal exchange.

FIG. 9 shows a laser diode system 100 in accordance with another embodiment of the present disclosure, which incorporates a cooling system 102 formed by a plurality of parallel-arranged submounts or substrates 102a, which each help to form a cooling subsystem that collectively make up the cooling system 102. The substrates 102a sandwich laser diode emitters $104_1$-$104_n$ between adjacent pairs of the substrates 102a, where each laser diode emitter is disposed on a separate substrate 102a. A facet 106 of each laser diode emitter 1041-104n emits a laser beam 108. Cooling channels 110 are formed along the full length of the laser diode emitters $104_1$-$104_n$ with cooling channels 104 running parallel to the length of each diode emitter $104_1$-$104_n$. FIG. 10 illustrates that the channels 110 may be formed by cooling fins 112a which project from a base portion 112. The cooling fins 112 include projecting "fingers" 114 therebetween, which can also increase the area of contact with the fluid flowing through the channels 110. The cooling system 102 may similarly be formed from a single monolithic block of suitable material (e.g., CuW), and is not limited to any one specific material for its construction. The fins 112 may also be covered with a metallized surface coating to reduce electrical resistance of the substrate 105 (i.e., the submount).

The diode stack is powered with electrical current passing serially through the diode-submount stack. The diode emitters $104_1$-$104_n$ and the submounts must conduct the electrical current and minimize resistive loss that reduces system efficiency. If the submount 102a material is not highly conductive, the submount and its fins can be coated with a conductive coating (i.e., metal) to reduce power loss by reducing overall submount resistance. Additionally, through-substrate vias may be employed to enhance electrical conduction through the submount 102a as needed. An advantage with the system 100 is that the cooling fins 112a have their tips electrically coupled (such as by soldering) to the substrate 105 of each of the laser diode bars $104_1$-$104_n$, which reduces the stress on the laser diode bars. Joining the non-continuous, etched submount to the diode emitters $104_1$-$104_n$ allows mechanical compliance that reduces stress coupling between the submount and the GaAs diode bar. The etched channels may thus act as strain relief and reduction if needed.

Figure 11:
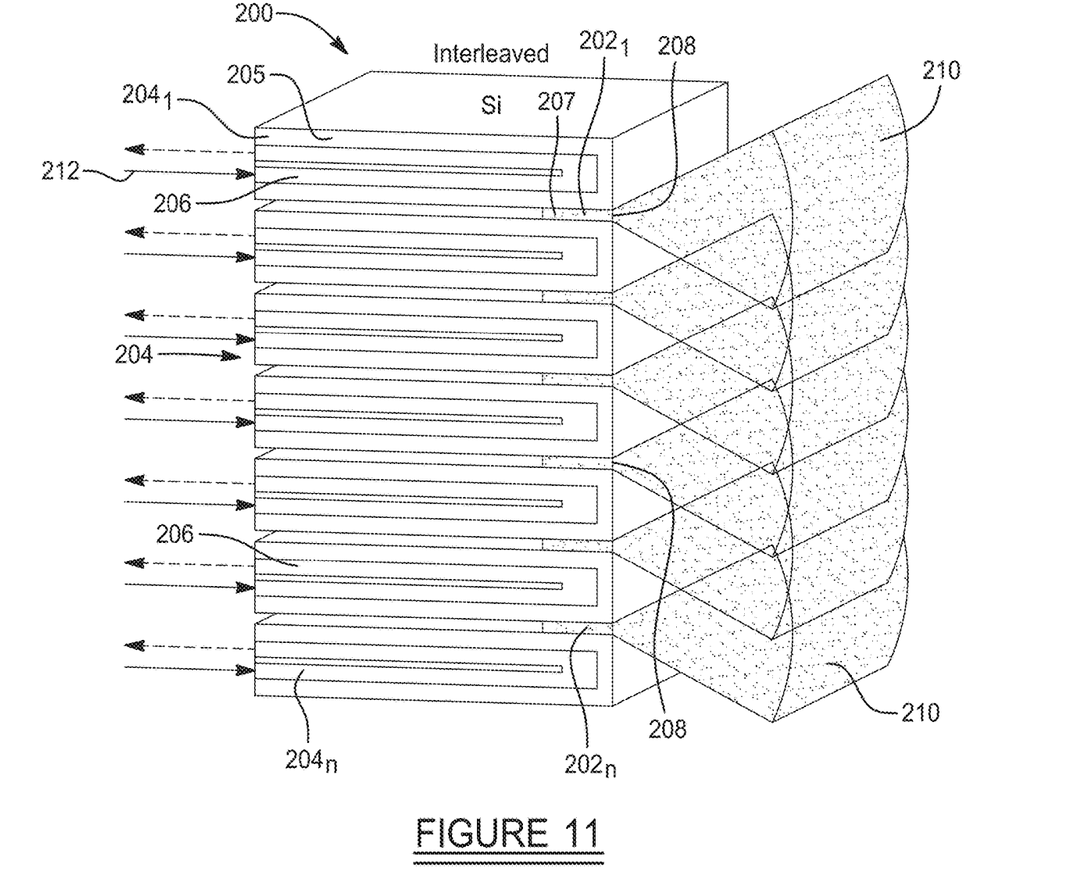
FIG. 11 shows a high level perspective cross sectional view of another embodiment of the present disclosure which incorporates an "interleaved" flow channel construction for the cooling subsystem that does not utilize immersion cooling where the working cooling fluid is not in contact with the emitter or facet or the laser diode emitter remains dry.

FIG. 11 shows a system 200 in accordance with another embodiment of the present disclosure. The system 200 includes a plurality of laser diode bars $202_1$-$202_n$ that are cooled by a cooling subsystem 204 made up of a plurality of parallel-arranged cooling subsystems $204_1$-$204_n$. In this example, each cooling subsystem $204_1$-$204_n$ includes a base portion 205 with a U-shaped cooling flow channel 206 formed therein. Each pair of base portions 205 is bonded to opposing surfaces of each of the substrates 207 of each diode bar $202_1$-$202_n$. In one embodiment the U-shape may be achieved by forming each cooling subsystem $204_1$-$204_n$ with a "sandwich" like or multiple-ply construction, to form the U-shaped flow channels 206. Cooling fluid 212 entering the flow channels 206 may enter as a liquid and may leave as a mixture of liquid and gas, or possibly strictly as a liquid, or strictly as a gas. As with the previously discussed embodiments, each laser diode bar $202_1$-$202_n$ includes a facet 208 which emits a laser beam 210.

The various embodiments of the system 10 described in the present disclosure all provide the important benefit of bringing the coolant as close as possible to the diode to directly cool the facet and extract heat from the length of the diode emitter cavity. Thermal gradients and temperature deltas are kept to a minimum by this arrangement, which further helps system performance. Diode packing density is greatly improved (improved overall brightness is critical) by passing the cooling fluid 30 through the space between diode emitters $12_1$-$12_n$, $104_1$-$104_n$/$202_1$-$202_n$. This helps to significantly reduce the thickness of the overall system 10, 100 or 200. Coolant can be used in a single (liquid) or biphasic (liquid and gas) arrangement for each of the embodiments described herein. Additionally, thermal cooling performance is so significantly improved that varied materials may be used for the cooling subsystem 20 to either maximize performance (i.e., Silicon Carbide) or lifetime (i.e., Gallium Arsenide (GaAs)). GaAs offers the opportunity for minimized stress on the diode bars 12a-12n by thermal expansion matching the cooling substrate to the diode bar itself. Minimizing stress will improve diode lifetime and power performance, and reduce the costs associated with damaged diode bars.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A laser diode system comprising:
   at least one substrate having a laser diode emitter supported on a surface of the at least one substrate, the laser diode emitter emitting a laser beam from a facet at one end of the laser diode emitter, along an axis parallel to the surface of the at least one substrate;
   a cooling subsystem disposed in contact with the surface of the at least one substrate of the laser diode emitter, and being independent of the substrate the cooling subsystem including a plurality of cooling fins spaced laterally of the substrate and forming a plurality of elongated cooling channels for circulating a cooling fluid therethrough to cool the laser diode emitter and the at least one substrate supporting the laser diode emitter; and
   wherein the cooling fluid also flows over the facet of the laser diode emitter.

2. The system of claim 1, further comprising:
   a container for containing the laser diode emitter and the cooling subsystem; and
   wherein the container is filled with the cooling fluid to fully submerge the laser diode emitter such that the facet is below an upper level of the cooling fluid.

3. The system of claim 2, wherein the cooling channels are configured such that the cooling fluid flows over the facet first, and then through each of the cooling channels.

4. The system of claim 1, wherein the elongated channels each run a full length of the at least one substrate of the laser diode emitter.

5. The system of claim 4, wherein the cooling fins are in contact with an emitter-side of the substrate, and wherein the at least one substrate helps to form the cooling channels.

6. The system of claim 1, wherein the cooling subsystem includes a base portion in contact with the substrate of the laser diode emitter, and the cooling fins project from the base portion and parallel to a major length of the laser diode emitter.

7. The system of claim 6, wherein the base portion and the cooling fins comprise a single monolithic component.

8. The system of claim 7, wherein the base portion is bonded to an emitter-side of the substrate.

9. The system of claim 6, wherein the cooling channels each form a U-shape within the base portion.

10. The system of claim 1, wherein the cooling fins each have a thickness of between about 10 microns and 50 microns.

11. The system of claim 1, wherein the cooling channels each have a thickness of between about 10 microns and 100 microns.

12. The system of claim 1, wherein the cooling subsystem is manufactured as a single monolithic section from at least one of Silicon, Silicon-Carbide, Copper-Tungsten, Copper-Diamond, or Gallium Arsenide.

13. A laser diode system comprising:
   a laser diode substrate having a plurality of laser diode emitters supported on the laser diode substrate, and a facet at one end of each one of said plurality of said laser diode emitter from which a laser beam is emitted;
   a cooling subsystem in contact with the plurality of laser diode emitters and including a base portion and a plurality of cooling fluid flow channels formed by a plurality of elongated fins projecting outwardly from the base portion, the plurality of elongated fins being sufficient in number to span substantially a full width of all of the plurality of laser diode emitters and being laterally spaced apart from the laser diode substrate;
   the plurality of cooling fluid flow channels configured to circulate a cooling fluid therethrough to cool the plurality of laser diode emitters and the laser diode substrate on which the plurality of laser diode emitters is mounted; and
   wherein the cooling fluid flows over the facet of each one of the plurality of laser diode emitters.

14. The system of claim 13, wherein the base portion is in contact with the substrate of each of the plurality of laser diode emitters.

15. The system of claim 14, wherein the base portion and the plurality of elongated fins are formed from at least one of Silicon, Silicon Carbide, Tungsten-Copper, Copper-Diamond, or Gallium Arsenide.

16. The system of claim 13, wherein each one of the plurality of elongated fins project perpendicularly away from the substrates of the plurality of laser diode emitters.

17. The system of claim 16, further comprising projecting fingers which project between each pair of adjacent cooling fins, which increase an area of contact with the cooling fluid flowing between each said pair of adjacent cooling fins.

18. The system of claim 13, wherein a tip of each one of the plurality of elongated fins is in contact with the substrates of the plurality of laser diode emitters.

19. The system of claim 18, wherein each of the tips are mechanically and electrically coupled to the substrate, and the substrate helps to form the plurality of cooling fluid flow channels.

20. A method for cooling a laser diode system, the method comprising:
   providing a substrate, a laser diode emitter supported on a surface of the substrate, and a facet at one end of the laser diode emitter from which a laser beam is emitted;
   arranging a cooling subsystem in contact with the surface of the substrate of the laser diode emitter;
   flowing a cooling fluid through elongated channels formed between fins of the cooling subsystem, where the fins project from a base portion of the cooling subsystem and are spaced laterally apart from the substrate; and
   wherein the cooling fluid flows over the facet of the at least one laser diode emitter and into the elongated channels.

21. The method of claim 20, further comprising placing the base portion of the cooling subsystem against the surface of the substrate.

22. A laser diode system comprising:
   a substrate having a laser diode emitter supported on a surface of the substrate, the laser diode emitter emitting a laser beam from a facet at one end of the laser diode emitter, along an axis parallel to the surface of the substrate;
   a cooling subsystem disposed in contact with the surface of the substrate of the laser diode emitter, the cooling subsystem including a plurality of cooling elements projecting outwardly and helping to at least partially define a plurality of elongated channels for circulating a cooling fluid therethrough to cool the laser diode emitter and the substrate supporting the laser diode emitter, and the plurality of elongated channels further being laterally spaced apart from the substrate; and
wherein the cooling fluid also flows over the facet of the laser diode emitter.

* * * * *